United States Patent
Kodama et al.

(10) Patent No.: US 9,887,029 B2
(45) Date of Patent: Feb. 6, 2018

(54) CONDUCTIVE COOLING-TYPE PERSISTENT CURRENT SWITCH, MRI APPARATUS AND NMR APPARATUS

(71) Applicant: Hitachi, Ltd., Tokyo (JP)

(72) Inventors: Motomune Kodama, Tokyo (JP); Kazuhide Tanaka, Tokyo (JP); Yota Ichiki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 531 days.

(21) Appl. No.: 14/421,470

(22) PCT Filed: Jul. 12, 2013

(86) PCT No.: PCT/JP2013/069090
§ 371 (c)(1),
(2) Date: Feb. 13, 2015

(87) PCT Pub. No.: WO2014/034295
PCT Pub. Date: Mar. 6, 2014

(65) Prior Publication Data
US 2015/0228391 A1    Aug. 13, 2015

(30) Foreign Application Priority Data
Aug. 29, 2012    (JP) .................................. 2012-188208

(51) Int. Cl.
*H01F 6/00*    (2006.01)
*H01F 6/06*    (2006.01)
(Continued)

(52) U.S. Cl.
CPC ........... *H01F 6/06* (2013.01); *G01R 33/3403* (2013.01); *G01R 33/3664* (2013.01);
(Continued)

(58) Field of Classification Search
CPC ..... H01F 6/00; H01F 6/02; H01F 6/06; G01R 33/3815
(Continued)

(56) References Cited

U.S. PATENT DOCUMENTS 3,359,394 A * 12/1967 Mains ..................... H01L 39/20
200/262
5,361,055 A * 11/1994 Peck ....................... H01L 39/20
335/216

(Continued)

FOREIGN PATENT DOCUMENTS

JP    1-137557 A    9/1989
JP    01-137557 U    9/1989
(Continued)

*Primary Examiner* — Alexander Talpalatski
(74) *Attorney, Agent, or Firm* — Volpe and Koenig, P.C.

(57) ABSTRACT

A technical problem is to turn a persistent current switch on and off at high speed with less heat input. The invention relates to a conductive cooling-type persistent current switch, including: a superconductive wire 1 through which a current is passed; a cooling stage 9 which cools the superconductive wire; and a heater 8 which heats the superconductive wire, wherein the superconductive wire is placed between faces which are each formed by the cooling stage and the heater, a core of the superconductive wire is magnesium diboride 6, and a base material 5 placed around an outer periphery of the core is a material having a resistivity of 10 μΩcm or more at 40 K.

15 Claims, 2 Drawing Sheets

(51) Int. Cl.
*G01R 33/3815* (2006.01)
*H01L 39/20* (2006.01)
*G01R 33/34* (2006.01)
*G01R 33/36* (2006.01)
*H01F 6/04* (2006.01)

(52) U.S. Cl.
CPC .......... *G01R 33/3815* (2013.01); *H01F 6/04* (2013.01); *H01L 39/20* (2013.01)

(58) Field of Classification Search
USPC ......................................................... 335/216
See application file for complete search history.

(56) References Cited

U.S. PATENT DOCUMENTS

| | | | |
|---|---|---|---|
| 7,569,520 B2* | 8/2009 | Tanaka | H01L 39/141 505/100 |
| 8,077,001 B2* | 12/2011 | Tanaka | H01F 6/003 335/216 |
| 2005/0245400 A1 | 11/2005 | Dou et al. | |
| 2007/0157450 A1 | 7/2007 | Takahashi et al. | |
| 2007/0194870 A1 | 8/2007 | Takahashi et al. | |
| 2009/0267716 A1* | 10/2009 | Tanaka | H01F 6/003 335/216 |
| 2012/0004110 A1* | 1/2012 | Takahashi | C01B 35/04 505/211 |
| 2013/0109574 A1* | 5/2013 | Stautner | G01R 33/3815 505/163 |
| 2013/0234815 A1* | 9/2013 | Milward | H01F 6/00 335/216 |
| 2014/0066313 A1* | 3/2014 | Tanaka | H01F 6/04 505/163 |

FOREIGN PATENT DOCUMENTS

| | | |
|---|---|---|
| JP | 08-190817 A | 7/1996 |
| JP | 2003-069093 A | 3/2003 |
| JP | 2004-179413 A | 6/2004 |
| JP | 2005-529832 A | 10/2005 |
| JP | 2006-228797 A | 8/2006 |
| JP | 2007-000875 A | 1/2007 |
| JP | 2007-221013 A | 8/2007 |

* cited by examiner

[FIG. 1]
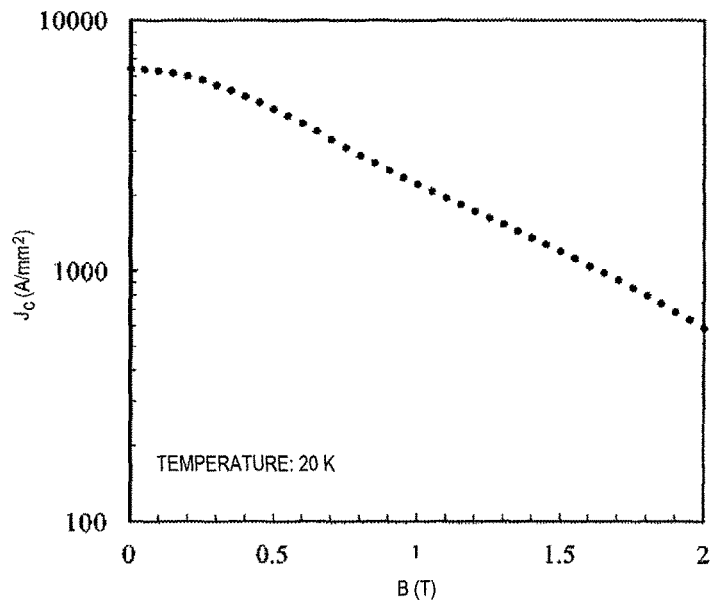
[FIG. 2]
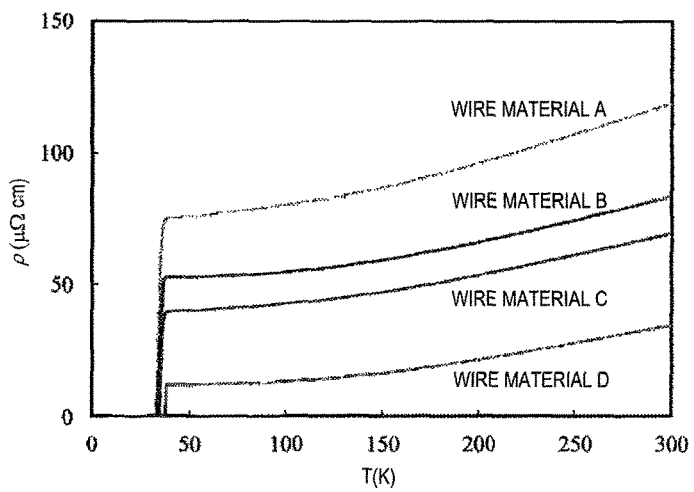
[FIG. 3]
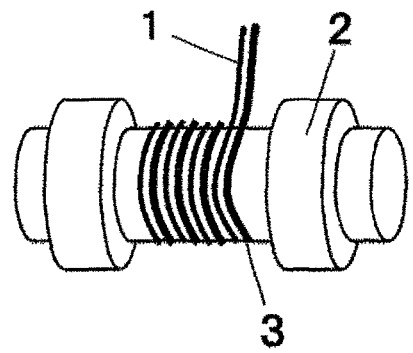

[FIG. 4]
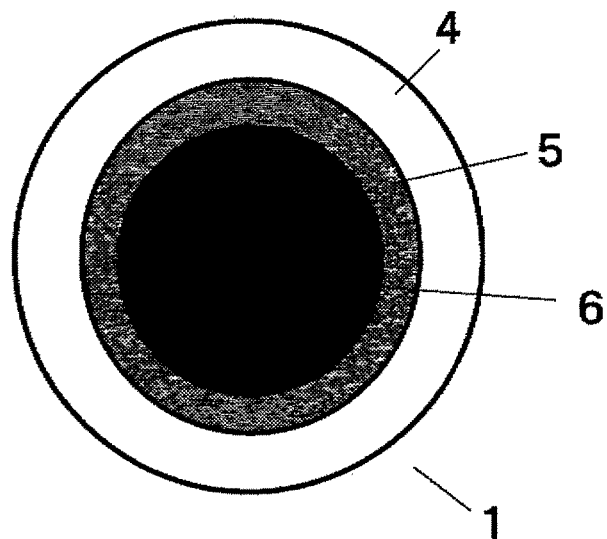
[FIG. 5]
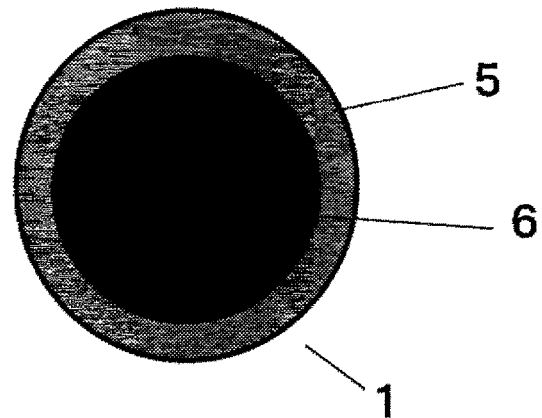
[FIG. 6]
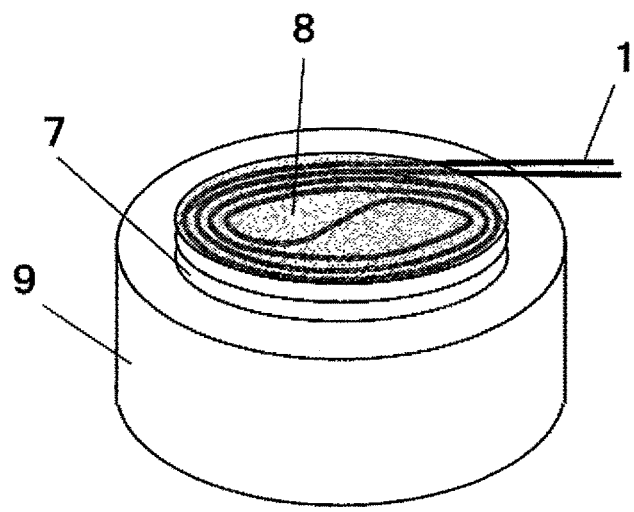

CONDUCTIVE COOLING-TYPE PERSISTENT CURRENT SWITCH, MRI APPARATUS AND NMR APPARATUS

TECHNICAL FIELD

The present invention relates to a conductive cooling-type persistent current switch, an MRI apparatus and an NMR apparatus.

BACKGROUND ART

In instruments which use extremely time stable magnetic field such as in NMR (nuclear magnetic resonance analysis) apparatuses or medical MRI (magnetic resonance imaging) apparatuses, an operation mode called a persistent current mode is desirable. With regard to the persistent current mode, a predetermined current is applied to a superconductive coil with an outside power supply to thereby generate a magnetic field, the positive and negative electrodes of the superconductive coil are then short-circuited at zero resistance, and the current of the outside power supply is made zero to thereby obtain a persistent current mode. Since the superconductive coil becomes a closed circuit of zero resistance, the superconductive magnet can continue to generate a predetermined magnetic field while the current does not decay. In this case, a device for short-circuiting the positive and negative electrodes of the superconductive coil is called a persistent current switch. The following properties are required for the persistent current switch.
(1) A current equivalent to the current which is applied to the superconductive coil can be applied at zero resistance.
(2) A superconductive state (on state) and a normal conductive state (off state) can be switched to one another by outside control, e.g. by heater heating.
(3) The resistance is high in the off state. For example, the resistance may be about several ohms.

On the other hand, superconductive magnets have heretofore been used by immersing them in liquid helium. However, because a high-temperature superconductor was discovered in the 1980's, and technologies for refrigerating machines have been developed, superconductive magnets have been able to be operated in a conductive cooling mode. The conductive cooling mode is a method for cooling a superconductive magnet by thermal conduction with a refrigerating machine. However, since a copper-oxide superconductor, which is the most typical of high-temperature superconductors, causes large temporal variations in a center magnetic field by magnetic flux creep, basically, a copper-oxide superconductor has not been operated in a persistent current mode.

In 2001, a new high-temperature superconductor of magnesium diboride was discovered. The critical temperature is 39 K, and, although the critical temperature is lower than that of a copper-oxide superconductor, the problem of the magnetic flux creep is small. Therefore, magnesium diboride is expected to be applied to a superconductive magnet which can be operated by a persistent current mode in a conductive cooling mode.

CITATION LIST

Patent Literature

PTL 1: JP-A-2004-179413

SUMMARY OF INVENTION

Technical Problem

In persistent current switches in conductive cooling-mode superconductive magnets, heat input with a heater for their on/off switching directly becomes a thermal load for refrigerating machines. The above-mentioned patent literature considers reductions in such a thermal load for refrigerating machines. However, the patent literature does not give adequate consideration to speeding up of switching by turning a persistent current switch on and off with the least heat input.

An object of the invention is to turn a persistent current switch on and off at high speed with less heat input.

Solution to Problem

In order to achieve the above-described object, the invention is characterized in that, in a conductive cooling-type persistent current switch, including: a superconductive wire through which a current is passed; a cooling stage which cools the superconductive wire; and a heater which heats the superconductive wire, the superconductive wire is placed between faces which are each formed by the cooling stage and the heater, a core of the superconductive wire is magnesium diboride, and a base material placed around an outer periphery of the core is a material having a resistivity of 10 μΩcm or more at 40 K.

Advantageous Effects of Invention

According to the invention, a persistent current switch can be turned on and off at high speed with less heat input.

BRIEF DESCRIPTION OF DRAWINGS

FIG. 1 A diagram showing a relation between a critical current density and an external magnetic field.
FIG. 2 A diagram showing a relation between an electric resistivity and a temperature.
FIG. 3 A conventional diagram in which a wire and a heater wire are wound around a reel.
FIG. 4 A cross-sectional diagram of a wire in which mixture powder of magnesium and boron is filled into a double metal tube.
FIG. 5 A cross-sectional diagram of a wire according to a first embodiment in which the outer layer of the double metal tube of FIG. 4 is removed.
FIG. 6 A perspective diagram of a persistent current switch according to the first embodiment.

DESCRIPTION OF EMBODIMENTS

The inventors found out that, in the course of imparting high performance to a magnesium diboride superconductive wire, the superconductive wire is very suitable for a conductive cooling-mode persistent current switch.

For a superior superconductive wire for persistent current switches, a wire which a superconductive current required in the "on" state (which may be, for example, 400 A as a typical value) can be applied to and which has the highest resistance value per unit length of the wire in the "off" state is preferred. When such a wire is used, the wire used for a persistent current switch can be shortened, and, consequently, this leads to a reduction in the thermal capacity of the persistent current switch.

The invention is used particularly for an NMR apparatus, medical MRI diagnostic apparatus and the like, and can be applied to a superconductive magnet which is operated in a persistent current mode.

FIG. 1 shows a relation between a critical current density Jc of a core of a magnesium diboride superconductive wire and an external magnetic field B, and FIG. 2 shows temperature dependency of its electric resistivity p. In addition, the wire was produced by the PIT (powder in tube) method using Fe as a base material. The PIT method is a production method in which the powder is filled into a metal sheath, the metal sheath is then subjected to an area reduction process to form a wire, and the wire is sintered.

Although a persistent current switch is generally placed in a space of a low magnetic field of 0.5 T or less, its Jc is very high in a magnetic field region of 0.5 T or less at 20 K as it shows 4,000 A/mm$^2$. For example, assuming that the JC is 4,000 A/mm$^2$, a cross-sectional area required to apply an electric current of 400 A results in 0.1 mm$^2$.

On the other hand, since the critical temperature of magnesium diboride is 39 K, it is assumed that a wire is heated to 40 K when a persistent current switch of a magnesium diboride superconductive wire is turned off. The resistivity in this case can be adjusted to 10 to 70 μΩcm as shown in wires A-D of FIG. 2, and therefore, can be controlled over a considerably wide range. For example, when a wire having a resistivity of 50 μΩcm at 40 K is used, the resistance per unit length is 5 Ω/m in a case where the cross-sectional area of the magnesium diboride is assumed as 0.1 mm$^2$. Therefore, for example, as for a length required to obtain a resistance of 1Ω, 20 cm is sufficient.

In fact, when the wire is produced by the PIT method, a base material is required as an outer layer around magnesium diboride in order to prevent oxidation of magnesium diboride. The resistivity of the base material is preferably within the same range as magnesium diboride. For example, assuming that a base material having a resistivity of 50 μΩcm at 40 K is used, and further assuming that a proportion of the cross-sectional area of the base material occupying the cross-section of the wire is about 0.5, a resistance per unit length of the superconductive wire will be 2.5 Ω/m, and, for example, a length thereof required to obtain a resistance of 1Ω is about 40 cm, and thus, it only requires a very short length.

The base material is preferably a material which does not react with magnesium. This is because, during a heat treatment for producing magnesium diboride, magnesium reacts with a base material, and a production of magnesium diboride is reduced, resulting in a reduction of the critical current density. As the best candidate for such a material, niobium-titanium (its resistivity at 40 K: 60 μΩcm) can be mentioned. Niobium-titanium is a material which is hard to react with magnesium and which has a high resistivity. When stainless steel is used as another base material, the mechanical strength can be enhanced.

In a case of a persistent current switch which is immersed and cooled in liquid helium and in which the core of the wire is niobium-titanium, it is required that the length of the wire is even about 10 m, and therefore, a structure in which a wire 1 is wound around a reel 2 together with a heater wire 3 is general (FIG. 3). However, since the length of the wire is tens of centimeters in the invention, a structure without a reel becomes possible. Since a reel generally occupies a large portion of a thermal capacity in a persistent current switch, a thermal capacity of a persistent current switch can be made very small by omitting such a reel.

In the invention, magnesium diboride is used for the core of the superconductive wire, and also, a material which has a high resistivity such as of magnesium diboride is used for its base material. That is, since the resistivity of magnesium diboride at 40 K is 10 μΩ/cm or more, also for a resistivity of the base material at 40 K, a material having a resistivity of 10 μΩcm or more at 40 K is used. By using such a wire, a resistance of several ohms required to turn a persistent current switch off can be realized with a wire having a small cross-sectional area and a short length.

Since the wire is short, it is not required that the wire is wound around a conventionally-seen reel. Further, since it is only required that the wire is placed on a flat or curved surface of a plate member such that the wire does not overlap, a wiring shape can also be in a spiral or meander shape, or the like. The wire is placed between the faces of the cooling stage for putting the switch into an "on" state and the heater for putting the switch into an "off" state to thereby efficiently heat or cool a portion of the wire which is held between both the members. Therefore, the switch can be turned on and off at high speed with less heat input. In the invention, a structure in which the wire is held between the faces of the cooling stage and the heater is only required, the cooling stage and the heater may be flat plates or curved plates, or may form curved surfaces. However, when the plate member (cooling stage or heater) is seen from a certain point, it is better for the plate member to remain in curvature or a curved surface to an extent that all wires placed on the plate member can be viewed from the certain point.

First Embodiment for Carrying Out the Invention

A cross-section of the wire is shown in FIG. 4 and FIG. 5. A double metal tube having an inner layer of niobium-titanium 5 and having an outer layer of copper 4 was prepared, and mixture powder of magnesium and boron which had sufficiently been mixed at a molar ratio of 1:2 was filled into the double metal tube. Then, the double metal tube was repeatedly subjected to a drawing process to thereby reduce its areas, and the diameter of the double metal tube was made φ 0.7 mm. This wire was immersed in 50%-diluted nitric acid to remove copper 4 in the outer periphery. In that case, the cross-section of the wire turned into an appearance as shown in FIG. 5, and a diameter of the wire combining the base material 5 and the core 6 was φ 0.5 mm.

After the wire was sintered at 800° C. for 1 hour, the critical current Ic thereof at 20 K and 0.5 T was measured. Consequently, the critical current Ic was 600 A, and it was revealed that the critical current was at a level which was adequately applicable to a superconductive magnet. Meanwhile, assuming that a temperature for turning a persistent current switch off is 40 K, the electric resistance per unit length at 40 K was 3 Ω/m, and it was revealed that a wire length of 33 cm was sufficient to obtain a resistivity of 1Ω.

When the wire length is 33 cm, it is not required that the wire is wound around a bobbin in the conventional way. Therefore, as shown in FIG. 6, the wire was wired in a spiral shape. After the wire was bent into a spiral shape, the wire was fixed onto a stainless steel jig, and was sintered at 800° C. for 1 hour to produce a magnesium diboride wire, and the magnesium diboride wire was removed from the jig. In this embodiment, the wire 1 was placed onto a FRP thermal resistor 7, and they were adhered to one another with a resin. A film-like heater 8, on which a stainless steel wire was arranged, was further placed on the upper part of the wire, and the heater 8 was also fixed thereto with a resin.

These were attached to the top of a cooling stage 9 of a 20 KGM (Gifford-MacMahon) refrigerating machine inside a vacuum-insulated cryostat. By providing the thermal resistor between the heater and the cooling stage, the conducting mount to the cooling stage can be reduced when the wire 1 is heated by the heater 8. Resins other than FRP may also be used.

By operating the GM refrigerating machine, the persistent current switch was cooled to 20 K. A current was applied to the persistent current switch in that state, it was confirmed that the resistance was zero at 400 A. Then, in a state where the heater 8 was heated at an input of 1 W, a current of 100 mA was applied to the persistent current switch, and the produced voltage was measured to thereby measure its resistance. Consequently, it was confirmed that a resistance of 1.3Ω could be obtained, and that the switch could sufficiently function as a persistent current switch at an input of 1 W.

Second Embodiment for Carrying Out the Invention

In this embodiment, when not only magnesium and boron but also carbides such as SiC and $B_4C$ are added as materials for the core of the superconductive wire, apart of B in crystals of magnesium diboride is replaced with C, an electron scattering center is introduced thereto, the resistivity of magnesium diboride at 40 K is further increased, and the resistivity of the wire per unit length can be increased. Therefore, a wire length required for wiring in the persistent current switch can be further shortened, and the persistent current switch can be made more compact.

It has been known that, when a part of B in crystals of magnesium diboride is replaced with C, an a-axis length of crystals evaluated by X-ray diffraction is shortened depending on an effective replacement amount of C. On the other hand, when the C-replacing amount is increased, a temperature at which magnesium diboride can maintain a superconductive state (critical temperature $T_c$) decreases, and therefore, a situation in which its critical current density is insufficient is caused. Therefore, an amount of carbides added thereto may be adjusted such that the a-axis length is within a range of 0.3062 to 0.3080 nm.

Third Embodiment for Carrying Out the Invention

In order to further increase the resistivity of magnesium diboride at 40 K, magnesium diboride may be produced in a condition where extra magnesium is blended therein, and then, the magnesium diboride may be heated at a temperature of about 200° C. in the atmosphere, thereby oxidizing unreacted and remaining magnesium. Magnesium oxide is an insulant, and a portion of magnesium oxide does not serves as a current pathway. Therefore, an effective cross-sectional area of magnesium diboride decreases, and the resistivity will be increased.

A filling rate of magnesium diboride in typical PIT wires is about 50 to 60 vol %. When the filling rate is decreased below 30 vol %, particles of magnesium diboride become discontinuous, and a continuous current pathway is lost. Therefore, the filling rate of magnesium oxide may be 20 vol % at a maximum. In addition, when the filling rate is 5 vol % or less, the resistivity does not increase so much.

Also, when extra boron is blended therein instead of blending extra magnesium, the resistivity will increase. Boron alone increases an electric resistivity at low temperature. Therefore, when extra boron is blended therein, unreacted and remaining boron also has a role in reducing an effective current path. Also in this case, the filling rate of magnesium diboride is 30 vol % or more, and the filling rate of boron is 5 to 20 vol %. Alternatively, both boron and magnesium oxide may be blended therein, and the total filling rate thereof may be 5 to 20 vol %.

Fourth Embodiment for Carrying Out the Invention

Although the outermost layer of copper of the wire was removed in the first embodiment. However, it is only required that only portions of the outermost layer which are heated by a heater are removed. When portions other than the heated portions are left, the wire can easily be soldered to the heater and the thermal resistor (or the heater and the cooling stage).

Fifth Embodiment for Carrying Out the Invention

When a persistent current switch obtained by the invention is used particularly for a superconductive magnet which operates in a persistent current mode at about 20 K by conductive cooling, a superconductive state and a normal conductive state can be switched to one another without putting a large heat load on a refrigerating machine. In particular, the persistent current switch is effective when being applied to an NMR apparatus, an medical MRI diagnostic apparatus, and the like.

REFERENCE SIGNS LIST

1 . . . a wire
2 . . . a reel
3 . . . a heater wire
4 . . . copper
5 . . . niobium-titanium (base material)
6 . . . magnesium diboride (core)
7 . . . a thermal resistor
8 . . . a heater
9 . . . a cooling stage

The invention claimed is:

1. A conductive cooling-type persistent current switch, comprising:
a superconductive wire through which a current is passed;
a cooling stage which cools the superconductive wire; and
a heater which heats the superconductive wire, wherein
the superconductive wire is placed between faces which are each formed by the cooling stage and the heater, a core of the superconductive wire is magnesium diboride, and a base material placed around an outer periphery of the core is a material having a resistivity of 10 μΩcm or more at 40 K.

2. The conductive cooling-type persistent current switch according to claim 1, wherein a thermal resistor is placed between the cooling stage and the wire.

3. The conductive cooling-type persistent current switch according to claim 1, wherein the base material is niobium-titanium or stainless steel.

4. The conductive cooling-type persistent current switch according to claim 2, wherein the thermal resistor is a resin or FRP.

5. The conductive cooling-type persistent current switch according to claim 1, wherein an a-axis length of a crystalline structure of the magnesium diboride is within a range of 0.3062 to 0.3080 nm.

6. The conductive cooling-type persistent current switch according to claim 1, wherein the core comprises magnesium oxide.

7. The conductive cooling-type persistent current switch according to claim 1, wherein copper is placed around an outer periphery of a portion of the base material, and the wire and the heater, and the wire and the cooling stage are connected to one another via the copper.

8. The conductive cooling-type persistent current switch according to claim 2, wherein copper is placed around an outer periphery of a portion of the base material, and the wire and the heater, and the wire and the thermal resistor are connected to one another via the copper.

9. An MRI apparatus comprising the conductive cooling-type persistent current switch according to claim 1.

10. An NMR apparatus comprising the conductive cooling-type persistent current switch according to claim 1.

11. The conductive cooling-type permanent current switch according to claim 1, wherein the base material is a material which does not react with magnesium at a temperature during a heat treatment for producing MgB2.

12. The conductive cooling-type permanent current switch according to claim 11, wherein the base material is niobium-titanium.

13. The conductive cooling-type permanent current switch according to claim 11, wherein the base material is stainless steel.

14. The conductive cooling-type permanent current switch according to claim 1, wherein copper is placed around an outer periphery of a portion of the base material.

15. The conductive cooling-type permanent current switch according to claim 2, wherein copper is placed around an outer periphery of a portion of the base material.

* * * * *